United States Patent [19]

Brownell

[11] Patent Number: 4,979,012
[45] Date of Patent: Dec. 18, 1990

[54] SEMICONDUCTOR DEVICE WITH BONDING PAD CONTACTS

[75] Inventor: David J. Brownell, Maple Grove, Minn.

[73] Assignee: Honeywell Inc., Minneapolis, Minn.

[21] Appl. No.: 441,335

[22] Filed: Nov. 21, 1989

Related U.S. Application Data

[60] Continuation of Ser. No. 253,789, Oct. 5, 1988, Pat. No. 4,797,375, which is a division of Ser. No. 36,185, Apr. 9, 1987, abandoned, which is a continuation of Ser. No. 658,104, Oct. 5, 1984, abandoned.

[51] Int. Cl.⁵ .......................................... H01L 27/02
[52] U.S. Cl. ....................................... 357/40; 357/41; 357/71; 357/68; 357/65
[58] Field of Search ................... 357/41, 40, 71, 68, 357/65

[56] References Cited

U.S. PATENT DOCUMENTS

| 3,872,495 | 3/1975 | Geller et al. | 357/40 X |
| 4,177,095 | 12/1979 | Nelson | 357/40 X |
| 4,491,856 | 1/1985 | Egawa et al. | 357/68 X |
| 4,631,569 | 12/1986 | Calhoun | 357/40 X |
| 4,649,413 | 3/1987 | Kelly | 357/40 X |
| 4,689,657 | 8/1987 | Percival et al. | 357/40 X |

Primary Examiner—William Mintel
Attorney, Agent, or Firm—W. T. Udseth

[57] ABSTRACT

A semiconductor device having a metal interconnect feature which comprises an array of metal features. Each of the metal features in the array has a size not substantially larger than a predetermined feature size. The metal features in the array are connected together by a metal layer deposited over the array of metal features.

5 Claims, 1 Drawing Sheet

SEMICONDUCTOR DEVICE WITH BONDING PAD CONTACTS

The Government has rights in this invention pursuant to Contract No. F33615-81-C-1527 awarded by the Department of the Air Force.

This application is a continuation of application Ser. No. 07/253,789 filed Oct. 5, 1988, now U.S. Pat. No. 4,797,375, issued Jan. 10, 1989, which is a division of application Ser. No. 036,185, filed Apr. 9, 1987 now abandoned, which is a continuation of application Ser. No. 658,104, filed Oct. 5, 1984 and now abandoned.

BACKGROUND OF THE INVENTION

The present invention relates to planarization of integrated circuits. More particularly, the present invention relates to use of particular metalization features in order to planarize dielectric layers in semiconductor device VLSI integrated circuits. As such integrated circuits become more complex, there is a need to increase the number of metal layers. To do so requires a total planarization scheme which planarizes not only small metal features but also large metal features such as bonding pad areas.

SUMMARY OF THE INVENTION

The present invention is semiconductor device having a metal interconnect feature which comprises an array of metal features. Each of the metal features in the array has a size not substantially larger than a predetermined feature size. The metal features in the array are connected together by a metal layer deposited over the array of metal features.

DETAILED DESCRIPTION OF THE PREFERRED EMBODIMENTS

Figure 1:
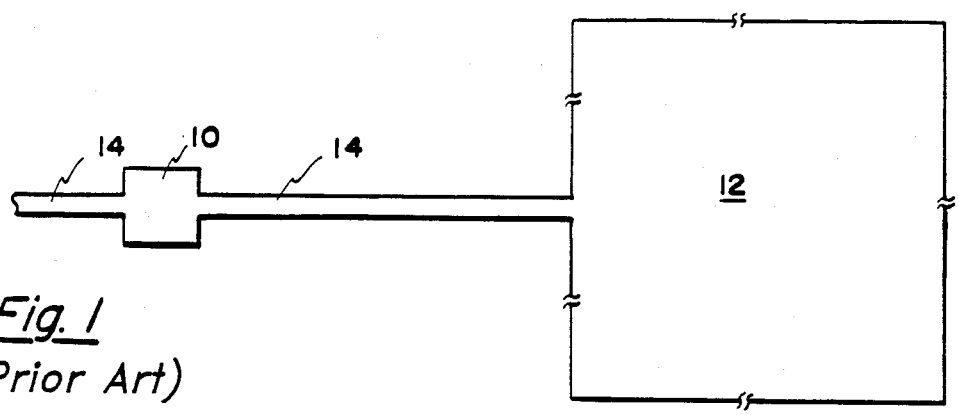
FIG. 1 illustrates a top view of a typical prior art first layer metal.

FIG. 1 shows a top view of a portion of a typical prior art first layer metal. The metal shown contains a pad 10 which, for the purposes of illustration, is approximately 2.5 micons by 2.5 microns; pad 10 could be a contact area to either an underlying device structure or a subsequent metal layer. Leading from this pad is a metal runner 14 which, for the purposes of illustration, is 1-1.2 micon wide; runner 14 carries current from small contact pad 10 to a large bonding pad area which, for the purposes of illustration, is 100 microns by 100 microns in size. The metal thickness in such structures is typically 6,000 to 10,000 angstroms.

Many planarization techniques can be used to make a planar structure over at least portions of a typical prior art first metal layer. One technique is the use of bias sputtered quartz. The bias sputtered quartz process tends to planarize micon sized features very well; however, larger pad areas which are on the order of 10-100 microns or larger will not typically be planarized if the planarization process is set to planarize much smaller features such as contact pad 10.

Figure 2:
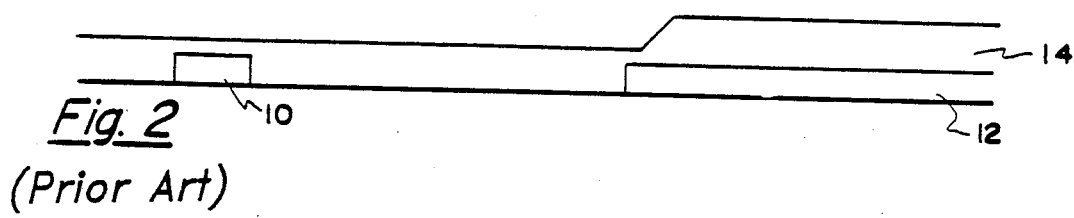
FIG. 2 is a cross-section view of a typical prior art first layer metal covered by a typical prior art dielectric layer.

FIG. 2 shows the typical profile of an oxide dielectric layer 14 over small metal feature 10 as well as over large bonding pad area 12 after typical prior art deposition of the dielectric. The figure illustrates the typical prior art result of RF bias sputtering used to deposit the dielectric, deposition and resputtering having been timed to planarize the dielectric region over small feature 10. The result is a substantial difference in oxide thickness above small feature 10 and larger feature 12. This creates a rough topologly which becomes a problem at via etch since, in order to clear the oxide dielectric from above pad area 12, small features such as pad 10 are exposed to a considerable overetch. This overetch causes problems such as polymer redeposition in vias and sputter damage of the underlying metal. Additionally, end point detection is very difficult to achieve.

Figure 3A:
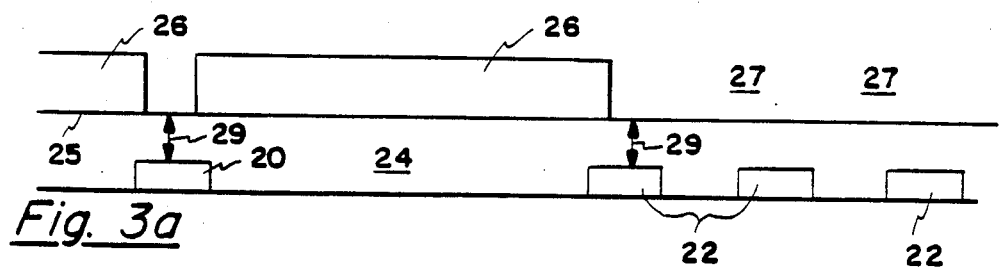
FIGS. 3a-3c are cross-sectional views of an implementation of the present invention.
Figure 3B:
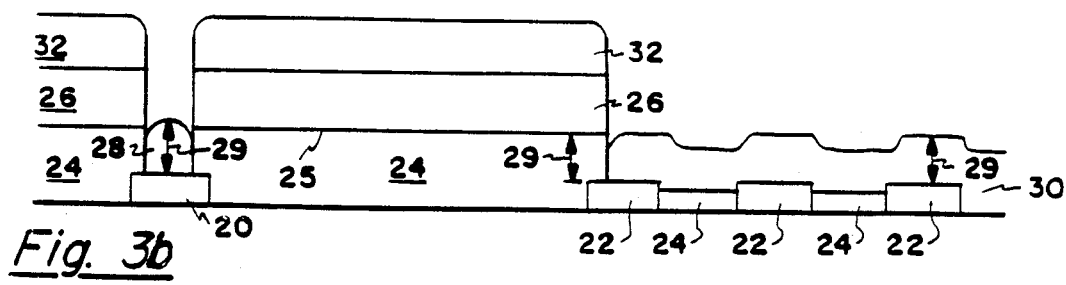
Figure 3C:
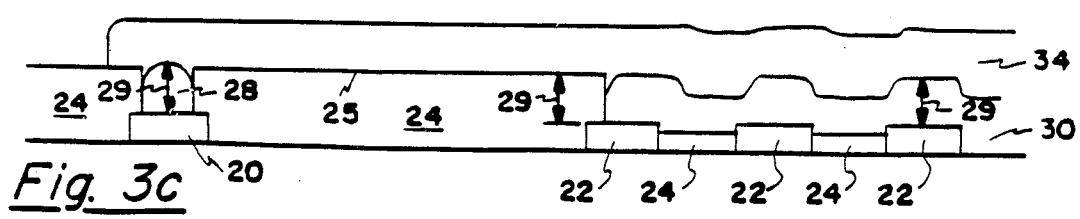

A process sequence comprising the present invention is depicted in FIGS. 3a-3c. FIG. 3a shows a metal layer which could be at any desired level in a semiconductor device, e.g., first, second, third, or fourth level metal. The layer illustrated comprises a small metal feature such as a runner or contact pad 20 and a large bonding pad area which is made up of small metal features such as runners 22 in an array. The width of features or runners 22 is not substantially wider than the width of a predetermined feature size such as that of a minimum metal line width or a width of a small contact pad such as 20.

In FIG. 3a, bias sputtered quartz 24 has been deposited uniformly over the layer of metal. Because the large pad area is comprised of an array of metal features having a predetermined feature size not substantially larger than the size of feature 20, the resulting structure is a planarized layer of dielectric 24 having a planarized upper surface 25 defining a dielectric thickness 29 above the metal layer. The spacing between features 22 is not critical.

Next, an etch resist such as photoresist 26 is applied and patterned to open up the large pad are in region 27 as well as to open up the smaller runner or contact pad area 20. Vias are then opened, for example, by wet chemical or dry plasma etching.

Since dielectric thickness 29 is the same over small metal features 20 as well as over the large pad area, end point detection and uniformity of the etch will produce little overetch on the metal and only slight overetching of the oxide in the pad area. The metal/oxide step in the pad area is typically on the order of 1000 angstroms or less.

The next step, as illustrated in FIG. 3b, is to deposit metal plugs 28 and 30 to fill the vias to a depth substantially equal to thickness 29. This is accomplished by depositing a metal by any desired technique such as evaporation or sputtering with etch resist 26 still in place, thus yielding a self-aligned metal plug process. Photoresist 26 is then lifted off to remove metal 32 which was deposited on etch resist 26.

At this point, the device is completely planar and is ready for next layer 34 of metal interconnection, which may or may not be formed in accordance with the present invention. Thus, the process described above may be continued for as many layers of metal as desired.

A variation of this process is to remove etch resist 26 after the via etch and then deposit additional metal layer 34 without going through the planarization plug process. While this variation does not give total planarization prior to additional metal 34 deposition, it is easier to manufacture since there is no lift off process needed.

The planarization of the large pad area using this method still eliminates overetch of small vias.

Accordingly, the present invention comprises a method of fabricating a semiconductor device comprising the step of defining metal interconnect features in a metal layer so that a metal feature 12 having a size substantially larger than a predetermined feature size such as 20 comprises an array of metal features 22. Each of metal features 22 in the array has a size not substantially larger than the predetermined feature size of feature 20.

Semiconductor devices fabricated in accordance with the present invention have a metal interconnect feature which comprises an array of metal features 22, each of the metal features 22 in the array having a size not substantially larger than a predetermined feature size such as the size of a metal runner or contact area 20. The preferred embodiment of a semiconductor device fabricated in accordance with the present invention further comprises a metal plug 30 substantially covering the array.

In practicing the present invention, the feature size selected for planarization is a matter of design choice. For example, by selecting the predetermined feature size to be that of a contact area 20 having, for example, a size of 2.5 microns by 2.5 microns rather than selecting the predetermined feature size to be the size of a metal runner having, for example, a width of 1 micron, the planarization of dielectric layer 24 for the larger 2.5 micron feature size will also adequately planarize similarly sized or smaller features such as runners. Further, the array of metal features 22 can be of any configuration desired. For example, features 22 may be separate runners, connected runners, crossed runners, a serpentine pattern, or small squares or other shapes.

The present invention is to be limited only in accordance with the scope of the appended claims, since others skilled in the art may devise other embodiments still within the limits of the claims.

The embodiments of the invention in which an exclusive property or right is claimed are defined as follows:

1. An integrated circuit semiconductor device having a principal surface, comprising:
    a metal interconnection line on said principal surface, said line having a line width and connecting selected portions of said integrated circuit;
    a substantially rectangular metal interconnect pad located on said principal surface and connected to said metal interconnection line, said pad being substantially larger in width and in length than said line width, wherein said pad includes:
    an array of spaced metal contacts arranged in an area, said area having a center, the most remote of said metal contacts from said center of said metal contacts approximately defining the perimeter of and said width and length of said pad, each of said metal contacts having a contact length substantially parallel to said pad length and a contact width substantially parallel to said pad width, and each being in contact with said principal surface, wherein said contact width of each of said metal contacts is no larger than four times said line width;
    a dielectric material which fills spaces between adjacent of said metal contacts; and
    a layer of metal overlying substantially all of and in contact with each of said metal contacts in said array.

2. The device of claim 1 wherein said line width is 2 microns or less and said contact width is 4 microns or less.

3. The device of claim 1 wherein the contact width of each said metal contacts is the same, and the contact length of each of said metal contacts is the same.

4. The device of claim 1 wherein each said metal contact has a substantially rectangular shape.

5. An integrated circuit semiconductor device having a principal surface, comprising:
    a metal interconnection line on said principal surface, said line having a line width and connecting selected portions of said integrated circuit;
    a metal interconnect pad having a substantially rectangular shape, said pad located on said principal surface and connected to said metal interconnection line, said pad being substantially larger in width and in length than said line width, wherein said pad includes:
    an array of spaced metal contacts, the array approximately defining said rectangular shape of said pad, each of said metal contacts having a contact length substantially parallel to said pad length and a contact width substantially parallel to said pad width and each being in contact with said principal surface, wherein said contact width of each of said metal contacts is no larger than four times said line width;
    a dielectric material which fills spaces between adjacent of said metal contacts; and
    a layer of metal overlying substantially all of and in contact with each of said metal contacts in said array.

* * * * *